United States Patent
Hori et al.

(10) Patent No.: US 10,143,041 B2
(45) Date of Patent: Nov. 27, 2018

(54) WIRELESS ACCESS SYSTEM AND CONTROL METHOD FOR SAME

(71) Applicant: NEC Corporation, Tokyo (JP)

(72) Inventors: Shinichi Hori, Tokyo (JP); Tomoyuki Yamase, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/569,802

(22) PCT Filed: Mar. 7, 2016

(86) PCT No.: PCT/JP2016/001220
§ 371 (c)(1),
(2) Date: Oct. 27, 2017

(87) PCT Pub. No.: WO2016/174805
PCT Pub. Date: Nov. 3, 2016

(65) Prior Publication Data
US 2018/0139802 A1    May 17, 2018

(30) Foreign Application Priority Data

Apr. 28, 2015  (JP) ................................. 2015-091784

(51) Int. Cl.
*H04W 88/08*    (2009.01)
*H03L 7/08*    (2006.01)
(Continued)

(52) U.S. Cl.
CPC ............. *H04W 88/085* (2013.01); *H03L 7/08* (2013.01); *H03L 7/0807* (2013.01); *H03M 3/02* (2013.01);
(Continued)

(58) Field of Classification Search
CPC ...... H04W 88/085; H03L 7/08; H03L 7/0807; H03L 27/36; H03M 3/02; H03M 3/30;
(Continued)

(56) References Cited

U.S. PATENT DOCUMENTS 7,577,367 B2* 8/2009 Way ................... H04B 10/2575
359/237
9,900,197 B1* 2/2018 Rada ..................... H04L 7/0041
(Continued)

FOREIGN PATENT DOCUMENTS

| JP | 2000-152300 A | 5/2000 |
| JP | 2002-057732 A | 2/2002 |

(Continued)

OTHER PUBLICATIONS

Written Opinion of the International Searching Authority of PCT/JP2016/001220 dated Apr. 5, 2016.
(Continued)

*Primary Examiner* — Dalzid Singh
(74) *Attorney, Agent, or Firm* — Sughrue Mion, PLLC

(57) ABSTRACT

Provided are a wireless access system provided with a remote unit capable of handling a high-frequency region without being made complicated, and a control method for the same. A wireless access system according to the present invention is provided with: a center unit (1); and a remote unit (3) that converts a baseband signal generated by the center unit (1) into a high-frequency signal and emits the high-frequency signal from an antenna (12). The center unit (1) includes a 1-bit modulator (5) that converts the baseband signal into a 1-bit signal on the basis of a generated clock signal and outputs the 1-bit signal. The remote unit (3) includes: a local generation unit (10) that extracts the clock signal from the 1-bit signal output from the center unit (1), and generates a local signal using the extracted clock signal (Continued)

as a reference signal; a filter (13) that extracts a desired band component from the 1-bit signal; and an up-converter (14) that converts, using the local signal, an output signal of the filter into a high-frequency signal.

10 Claims, 15 Drawing Sheets

(51) Int. Cl.
    *H03M 3/02*     (2006.01)
    *H03M 3/00*     (2006.01)
    *H04B 10/2575*     (2013.01)
    *H04B 10/40*     (2013.01)
    *H04L 27/36*     (2006.01)
    *H04B 1/40*     (2015.01)
    *H04Q 11/00*     (2006.01)

(52) U.S. Cl.
    CPC ................ *H03M 3/30* (2013.01); *H04B 1/40* (2013.01); *H04B 10/25752* (2013.01); *H04B 10/40* (2013.01); *H04L 27/36* (2013.01); *H04Q 11/0067* (2013.01); *H04Q 11/0071* (2013.01); *H04B 2210/006* (2013.01)

(58) Field of Classification Search
    CPC .... H04B 1/40; H04B 10/25752; H04B 10/40; H04B 2210/006; H04L 27/36; H04Q 11/0067; H04Q 11/0071
    USPC .......................................................... 398/116
    See application file for complete search history.

(56) References Cited

U.S. PATENT DOCUMENTS

| | | | |
|---|---|---|---|
| 2001/0050962 A1 | 12/2001 | Adachi et al. | |
| 2005/0233710 A1* | 10/2005 | Lakkis | H04B 1/71632 455/102 |
| 2009/0232191 A1* | 9/2009 | Gupta | H04L 27/2096 375/216 |
| 2014/0219384 A1 | 8/2014 | Hori | |

FOREIGN PATENT DOCUMENTS

| | | |
|---|---|---|
| JP | 2013-081106 A | 5/2013 |
| WO | 2012/153567 A1 | 11/2012 |

OTHER PUBLICATIONS

International Search Report of PCT/JP2016/001220 dated Apr. 5, 2016.

* cited by examiner

Fig. 9

| VALUE OF 1-bit DL SIGNAL INPUT WHEN OUTPUT FROM DIGITAL SINE GENERATOR 43 IS 1 | SIGNAL OUTPUT AS I" | SIGNAL OUTPUT AS Q" |
|---|---|---|
| '1' | '1' | '0' |
| '0' | '0' | '-1' |
| '-1' | '-1' | '-0' |
| '-0' | '-0' | '1' |

WIRELESS ACCESS SYSTEM AND CONTROL METHOD FOR SAME

CROSS-REFERENCE TO RELATED APPLICATIONS

This application is a National Stage of International Application No. PCT/JP2016/001220 filed Mar. 7, 2016, claiming priority based on Japanese Patent Application No. 2015-091784 filed Apr. 28, 2015, the contents of all of which are incorporated herein by reference in their entirety.

TECHNICAL FIELD

The present invention relates to a wireless access system and a method for controlling the wireless access system, and in particular, to a wireless access system that includes a center unit and a remote unit placed in a location away from the center unit and a method for controlling the wireless access system.

BACKGROUND ART

In an access network of a mobile network, a wireless access system that uses optical fibers as illustrated in FIG. 14 is placed in a weak signal area such as an underground mall and inside of a building where radio waves from outdoor base stations are hard to reach, as a system for providing radio waves at low cost. The wireless access system illustrated in FIG. 14 includes a center unit 101, an optical access unit 102, and a remote unit 103. The center unit 101 includes a digital baseband 104, a parallel-serial converter 105, and a serial-parallel converter 106. The optical access unit 102 includes electrical-optical converters (E/O converters) 107 and 112, optical fibers 109 and 110, and optical-electrical converters (O/E converters) 108 and 111. The remote unit 103 includes a serial-parallel converter 113, a parallel-serial converter 114, a DA converter (DAC) 115, an AD converter (ADC) 116, an up-converter 117, a down-converter 118, an antenna 119, and a crystal 120. The crystal 120 generates a reference signal required for generating a local signal for frequency conversion by the up-converter 117 and the down-converter 118.

In the wireless access system illustrated in FIG. 14, digital quadrature signals (I, Q) generated by the digital baseband 104 of the center unit 101 are parallel-serial converted by the parallel-serial converter 105, and then are transmitted to the remote unit 103 placed in a weak signal area through the optical access unit 102. Then, the signal is serial-parallel converted by the serial-parallel converter 113 in the remote unit 103, converted to an analog signal by the DA converter 115, then converted to a high-frequency signal by the up-converter 117 and emitted through the antenna 119. In reverse of the transmission, a signal received by the antenna 119 is converted to a low-frequency-band signal by the down-converter 118 in the remote unit 103, then converted to a digital signal by the AD converter 116, parallel-serial converted by the parallel-serial converter 114, and then transmitted to the center unit 101 through the optical access unit 102.

The wireless access system illustrated in FIG. 14 can be installed in various locations by placing the center unit 101 at a centralized station and placing the small and lightweight remote unit 103 in a weak signal area such as an underground mall. Considering that the global urban population is increasing, many facilities where people gather are expected to be built, and a large number of the wireless access systems will be installed in order to resolve weak signal areas in such facilities.

One example of a wireless access system in which a remote unit is further reduced in size and weight is described in PTL 1. FIG. 15 illustrates a configuration of the wireless access system in PTL 1. The wireless access system illustrated in FIG. 15 includes a center unit 201, an optical access unit 202, and a remote unit 203. The center unit 201 includes a digital baseband 204, a digital quadrature modulator 205, and a bandpass (BP) $\Delta\Sigma$ modulator 206. The optical access unit 202 includes an electrical-optical converter 207, an optical fiber 208, and an optical-electrical converter 209. The remote unit 203 includes a bandpass filter (BPF) 210 and an antenna 211.

In the wireless access system illustrated in FIG. 15, digital quadrature signals (I, Q) generated by the digital baseband 204 of the center unit 201 are converted to a high-frequency radio signal by the digital quadrature modulator 205, and then are converted to a 1-bit signal by the bandpass $\Delta\Sigma$ modulator 206 designed to minimize influence of quantization noise in a frequency band occupied by radio signals. Then, the center unit 201 transmits the 1-bit signal to the remote unit 203 through the optical access unit 202. The remote unit 203 filters the received 1-bit signal through the BPF 210 to extract the high-frequency radio signal and emits the high-frequency radio signal through the antenna 211.

When compared with the configuration illustrated in FIG. 14, the wireless access system illustrated in FIG. 15 does not require the serial-parallel converter 113, the parallel-serial converter 114, and the crystal 120 of the remote unit, thus achieving further reduction in size and weight of the remote unit.

CITATION LIST

Patent Literature

[PTL 1] Japanese Laid-open Patent Publication No. 2013-81106

SUMMARY OF INVENTION

Technical Problem

In the configuration described in PTL 1 and illustrated in FIG. 15, the bandpass $\Delta\Sigma$ modulator 206 placed in the center unit 201 has a limited operating speed, and the highest operating speed achievable with present device performance is about 1 GHz. Current mobile networks use not only frequency bands equal to or less than 1 GHz but also frequency bands up to 2.6 GHz, and future mobile networks will use higher frequency bands such as a 3.5 GHz band and a 5 GHz band. The configuration in FIG. 15 has a problem that the configuration cannot be used in high-frequency bands equal to or higher than 1 GHz.

On the other hand, the configuration in FIG. 14 is capable of handling a high-frequency region equal to or higher than 1 GHz, because bandpass $\Delta\Sigma$ modulation is not used and the remote unit independently has a conversion function to a high frequency band. However, the configuration has a problem that complexity of the remote unit is high as compared with the configuration in FIG. 15, as described above.

The present invention has been made in order to solve these problems and an object of the present invention is to provide a wireless access system including a remote unit that is capable of handling a high-frequency region without added complexity, and a method for controlling the wireless access system.

Solution to Problem

According to a first aspect of the present invention, a wireless access system comprises: a center unit; and a remote unit that is placed in a location away from the center unit, converts a baseband signal generated at the center unit to a high-frequency signal, and emits the high-frequency signal through an antenna, wherein the center unit comprises a digital baseband that generates the baseband signal, an oscillator that generates a clock signal, and a 1-bit modulator that converts the baseband signal to a 1-bit signal, based on the clock signal, and outputs the 1-bit signal, and the remote unit comprises a local generation unit that extracts a clock signal from the 1-bit signal output from the center unit and generates a local signal by using the extracted clock signal as a reference signal, a filter that extracts a desired band component from the 1-bit signal, and an up-converter that converts an output signal of the filter to the high-frequency signal by using the local signal.

According to a second aspect of the present invention, a control method for controlling a wireless access system comprises a center unit and a remote unit that is placed in a location away from the center unit, converts a baseband signal generated at the center unit to a high-frequency signal, and emits the high-frequency signal through an antenna, the control method comprises: converting, by the center unit, a baseband signal to a 1-bit signal by using a clock signal; transmitting, by the center unit, the 1-bit signal to the remote unit; extracting, by the remote unit, a clock signal from the 1-bit signal; generating, by the remote unit, a local signal by using the extracted clock signal as a reference signal; extracting, by the remote unit, a desired band component from the 1-bit signal; and converting, by the remote unit, the desired band component to the high-frequency signal by using the local signal.

Advantageous Effects of Invention

The present invention can provide a wireless access system including a remote unit that is capable of handling a high-frequency region without added complexity, and a method for controlling the wireless access system.

BRIEF DESCRIPTION OF DRAWINGS

FIG. 9 is a diagram illustrating input and output signals of a digital quadrature demodulator according to the second example embodiment.

DESCRIPTION OF EMBODIMENTS

First Example Embodiment

Figure 1:
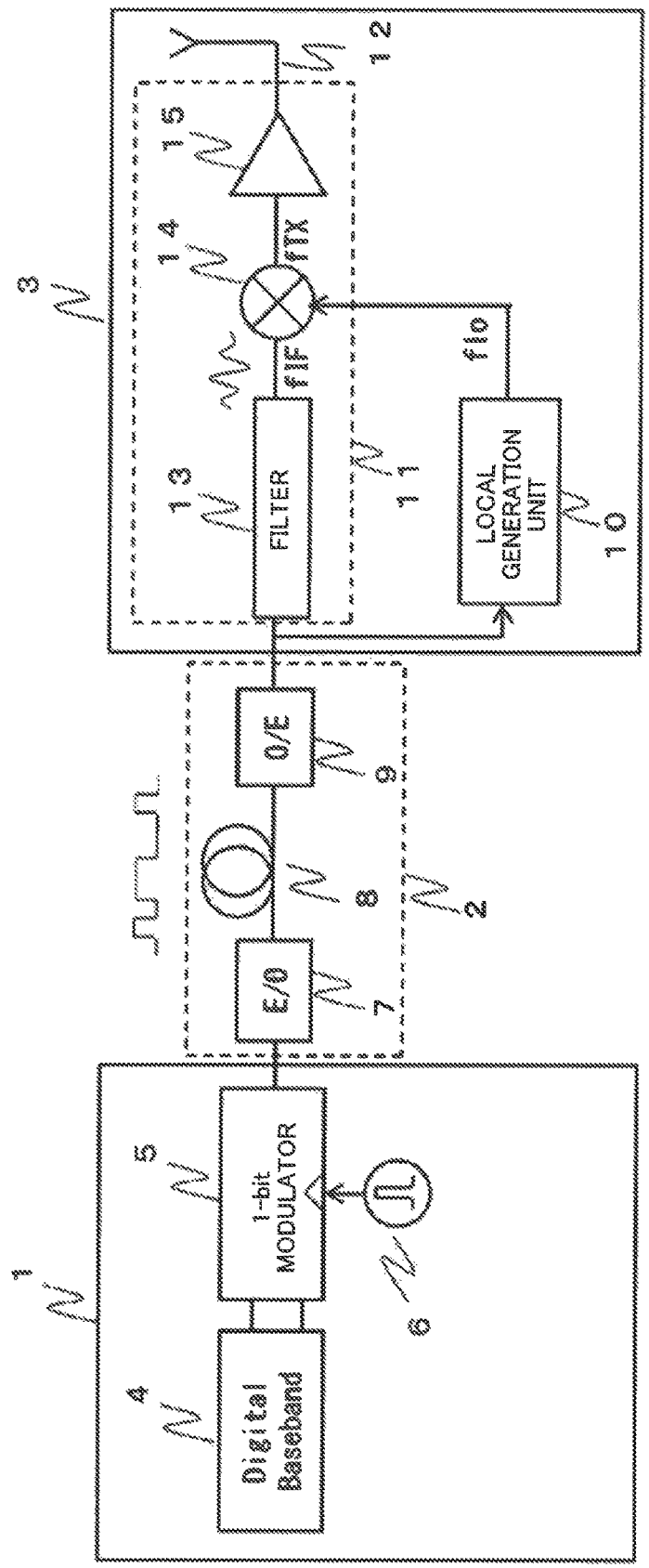
FIG. 1 is a configuration diagram of a wireless access system according to a first example embodiment.

Example embodiments of the present invention will be described below with reference to drawings.

First, a configuration of a wireless access system according to a first example embodiment of the present invention will be described by using FIG. 1. The wireless access system includes a center unit 1, an optical access unit 2 and a remote unit 3.

The center unit 1 includes a digital baseband 4, a 1-bit modulator 5 and an oscillator 6.

The digital baseband 4 generates downlink signals (DL signals) consisting of two quadrature signals (referred to as I and Q signals) represented by multiple bits and outputs the generated DL signals to the 1-bit modulator 5. The oscillator 6 generates a clock signal and outputs the generated clock signal to the 1-bit modulator 5.

The 1-bit modulator 5 converts the DL signals received from the digital baseband 4 to a 1-bit-DL signal by using the clock signal received from the oscillator 6. The 1-bit modulator 5 outputs the 1-bit-DL signal to the optical access unit 2. A specific configuration of the 1-bit modulator 5 will be described later in detail.

The optical access unit 2 includes an electrical-optical converter (E/O converter) 7, an optical fiber 8 and an optical-electrical converter (O/E converter) 9. The E/O converter 7 converts a 1-bit-DL signal received from the 1-bit modulator 5 to an optical signal and outputs the optical signal to the optical fiber 8. The optical fiber 8 transmits the optical signal to a remote location and outputs the optical signal to the O/E converter 9. The O/E converter 9 receives the optical signal in the remote location. The O/E converter 9 converts the optical signal back to the 1-bit-DL signal and outputs the 1-bit-DL signal to the remote unit 3.

The remote unit 3 includes a local generation unit 10, a transmission unit 11 and an antenna 12. Further, the transmission unit 11 includes a filter 13, an up-converter 14 and a power amplifier 15.

The filter 13 is constituted by a bandpass filter (BPF) in the first example embodiment of the present invention. The filter 13, the passband of which is set to an intermediate frequency band fIF, has the function of passing only desired signal components that are present in or near the intermediate frequency band fIF in a 1-bit-DL signal received from the O/E converter 9 and filtering out quantization noise other than the desired signal. The filter 13 outputs an output signal consisting of extracted desired band components to the up-converter 14.

The local generation unit 10 extracts a clock signal from a 1-bit-DL signal received from the O/E converter 9 and uses the clock signal as a reference signal to generate a local signal. The local generation unit 10 outputs the generated local signal to the up-converter 14. A specific configuration of the local generation unit 10 will be described later in detail.

The up-converter 14 multiplies a 1-bit-DL signal in the intermediate frequency band fIF received from the filter 13 by a local signal in a local frequency band flo received from the local generation unit 10 to generate an RF-DL signal with a frequency converted to a radio-frequency (RF) band ftx, as given by the following formula:

$$fTX = fIF + flo$$

The up-converter 14 outputs the generated RF-DL signal to the power amplifier 15. The power amplifier 15 amplifies the RF-DL signal received from the up-converter 14 to a desired level and emits the amplified RF-DL signal through the antenna 12.

A configuration of the 1-bit modulator 5 will be described next by using FIG. 2. The 1-bit modulator 5 includes a ΔΣ modulator 16, a ΔΣ modulator 17 and a digital up-converter 18.

In this configuration, an I signal out of multibit I and Q signals generated by the digital baseband 4 is input into the ΔΣ modulator 16 and is converted to a 1-bit signal, I', by ΔΣ modulation. The Q signal out of the multibit I and Q signals generated by the digital baseband 4 is input into the ΔΣ modulator 17 and is converted to a 1-bit signal, Q', by ΔΣ modulation.

The digital up-converter 18 quadrature-modulates I and Q signals to convert the I and Q signals into the intermediate frequency band fIF by multiplying outputs from the ΔΣ modulators 16 and 17 by a digital sinusoidal wave that repeats a four-value pattern { 1, 0, −1, 0} and a four-value pattern {0, 1, 0, −1} that is delayed by 1. Note that the digital up-converter repeatedly outputs a pattern of {I', Q', −I', −Q'}, where I' and Q' are respectively outputs from the two ΔΣ modulators 16 and 17.

Figure 2:
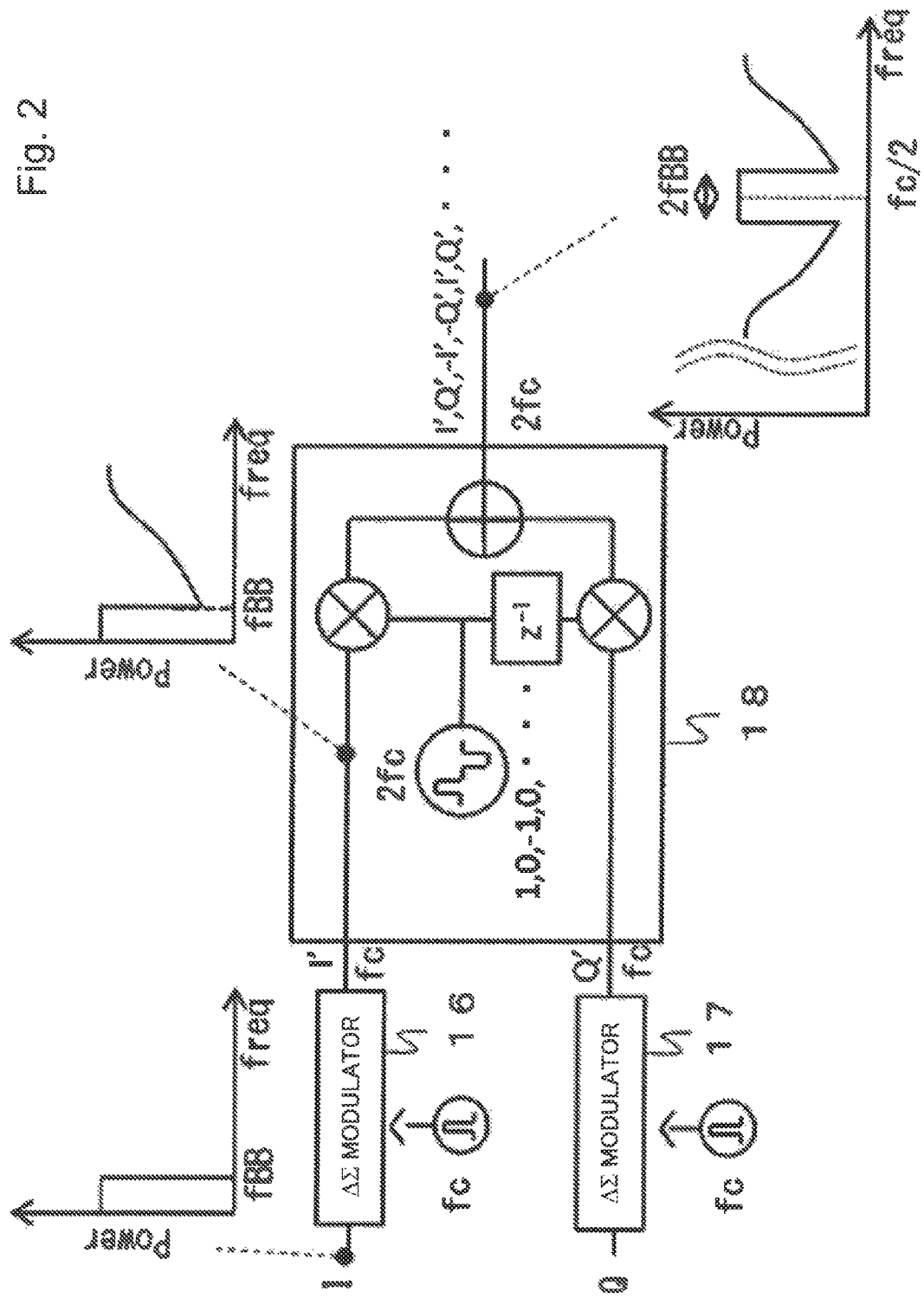
FIG. 2 is a configuration diagram of a 1-bit modulator according to the first example embodiment.

Further, let fc denote the clock frequency input into the ΔΣ modulators 16 and 17 and 2fc denote the clock frequency of a digital sinusoidal wave input into the digital up-converter 18 as illustrated in FIG. 2, then the intermediate frequency fIF is fc/2, as can be deduced from the fact that the period of the digital sinusoidal signal is fc/2 which is 1/4 of the period of the clock frequency.

Figure 3:
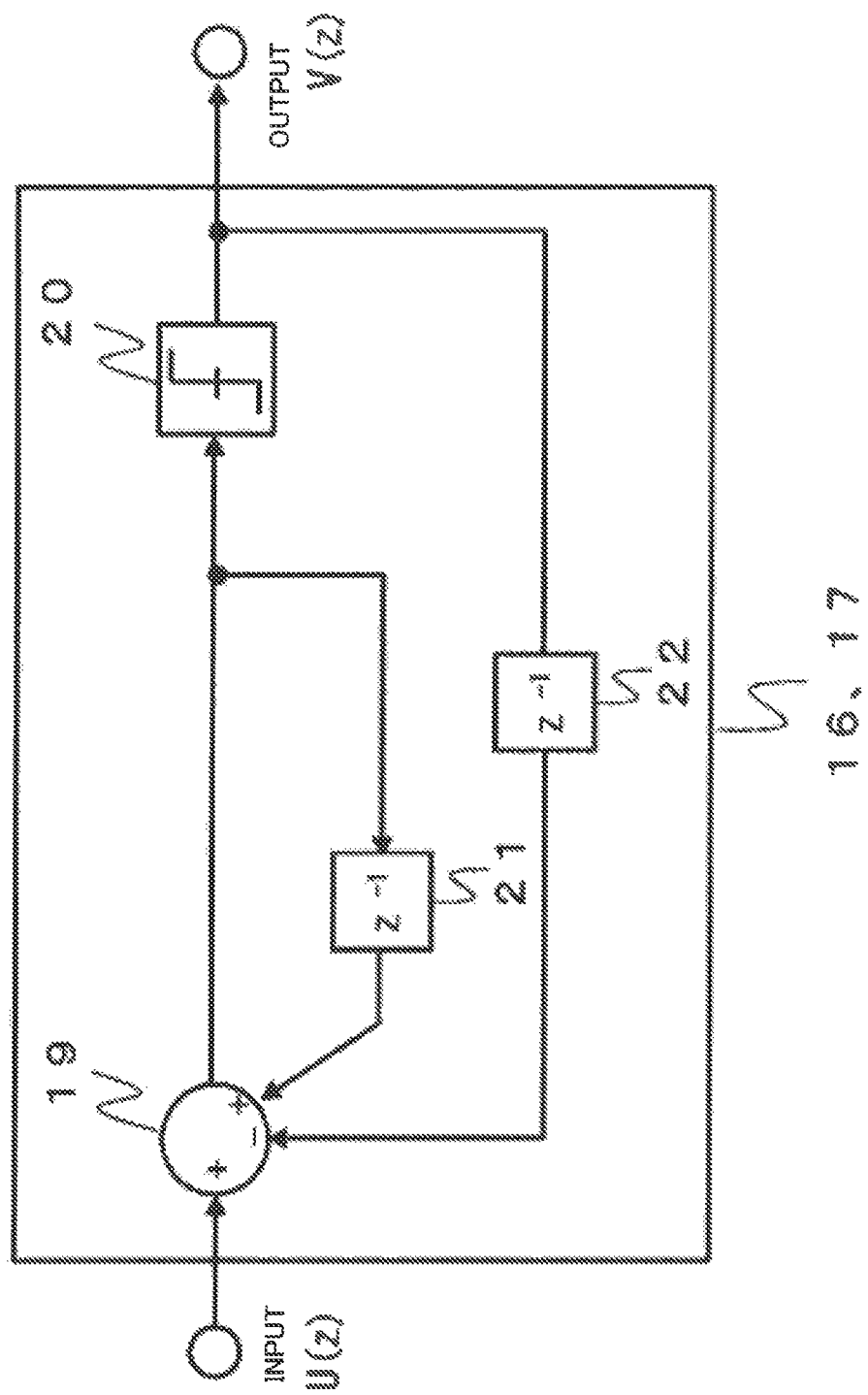
FIG. 3 is a configuration diagram of a ΔΣ modulator according to the first example embodiment.

A configuration of the ΔΣ modulators 16 and 17 will be described next by using FIG. 3. Each of the ΔΣ modulators 16 and 17 includes an adder 19, a quantizer 20, a delay device ($Z^{-1}$) 21, and a delay device 22.

A characteristic of the ΔΣ modulators 16 and 17 can be expressed in the z domain as follows:

$$V(z) = U(z) + (1-z^{-1}) \cdot E(z)$$

where U(z) is an input into the ΔΣ modulators 16 and 17, V(z) is an output, and E(z) is quantization noise caused at the quantizer 20.

As illustrated in FIG. 2, the outputs from the ΔΣ modulators 16 and 17 in which I and Q signals are input from the digital baseband 4 exhibit a signal distribution in which desired signals are preserved at and near DC and larger quantization noise appears regions closer to high-frequency side. In an output from the digital up-converter 18, desired signals generated from the I and Q signals are preserved at and near the intermediate frequency fIF (=fc/2) and quantization noise increases with increasing distance from the intermediate frequency. Conversely, a high signal-to-noise ratio is maintained at and near fc/2.

A configuration of the local generation unit 10 will be described by using FIG. 4. The local generation unit 10 is constituted by a clock data recovery circuit (CDR) 23, extracts a clock signal from a 1-bit-DL signal received from the O/E converter 9, and generates a high-frequency tone (local signal).

Figure 4:
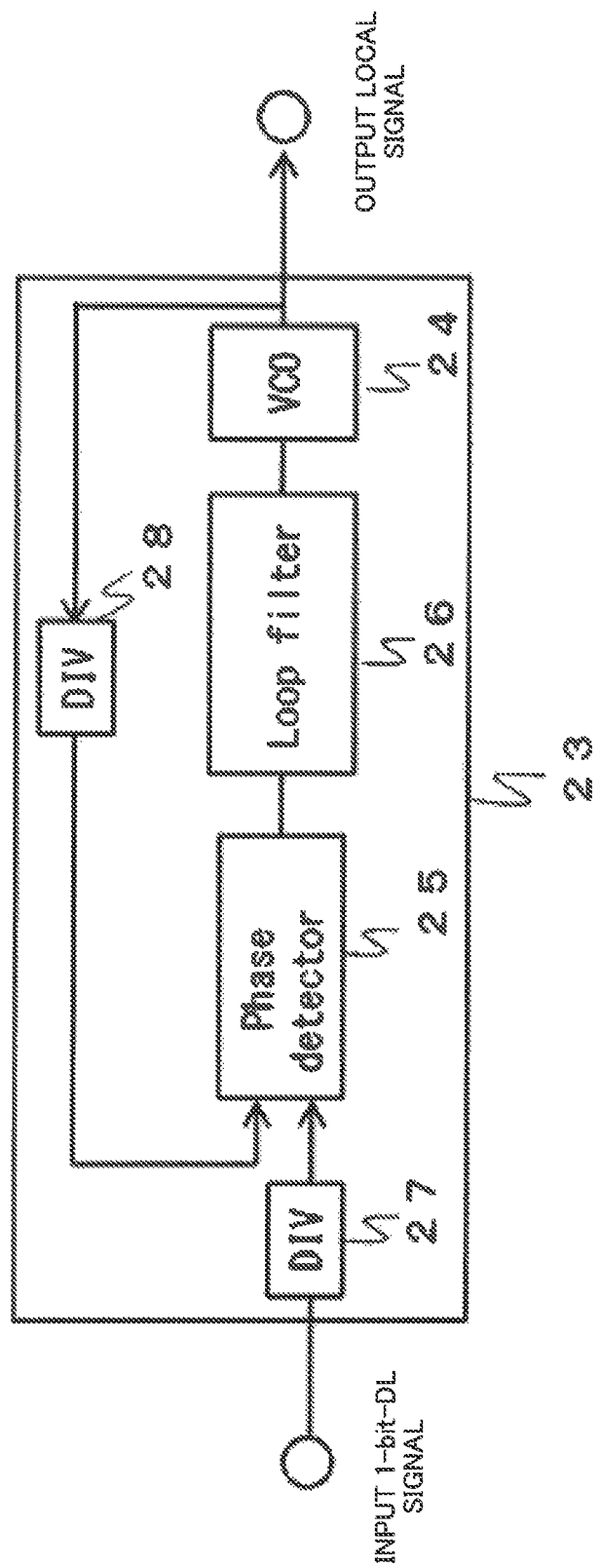
FIG. 4 is a diagram of a local generation unit according to the first example embodiment.

The CDR 23 includes a voltage controlled oscillator (VCO) 24, a phase detector (PD) 25, a loop filter (LF) 26, and dividers (DIV) 27 and 28, as illustrated in FIG. 4.

An output from the VCO 24 is input into the phase detector 25 through the divider 28 together with an external reference signal. The phase detector 25 detects a difference between the two input signals, the LF 26 extracts only required information at and near DC, and the information is input into an oscillation control terminal of the VCO 24. Through the feedback configuration in which a signal resulting from frequency dividing of the output from the VCO 24 returns to the oscillation control terminal of the VCO 24 through the phase detector 25, the CDR 23 is stabilized when the phase and frequency of the frequency-divided signal of the VCO 24 match the phase and frequency of the external reference signal.

When a 1-bit-DL signal frequency-divided by the divider 27 is input into the phase detector 25 as the external reference signal, the oscillating frequency (fVCO) of the VCO 24 and the clock rate (fclkdl) of the 1bit-DL will be in the following relationship in the stable state of the feedback circuit:

$$fVCO = fclkdl \times DIV2/DIV1$$

Here, DIV1 is the division ratio of the divider 27 into which the 1-bit-DL signal received from the O/E converter 9 is input. DIV2 is the division ratio of the divider 28 into which the output signal of the VCO 24 is input.

As indicated by the equation, fVCO is uniquely determined by fclkdl. In other words, the frequency of the local signal generated by the local generation unit 10 of the remote unit 3 can be uniquely determined by the clock rate of the clock signal output from the oscillator 6 to the 1-bit modulator 5 of the center unit 1. Accordingly, the frequency of an RF-DL signal emitted through the antenna 12 can also be uniquely determined by the clock rate of the clock signal of the oscillator 6.

Note that the oscillator 6 of the center unit 1 may include the function of changing the clock rate of the clock signal to be output to the 1-bit modulator 5. Specifically, by changing the clock rate of the clock signal to be output from the oscillator 6 to the 1-bit modulator 5 of the center unit 1, the frequency of the local signal generated by the local generation unit 10 of the remote unit 3 can be controlled and the frequency of the RF-DL signal to be emitted through the antenna 12 can be changed.

Figure 5:
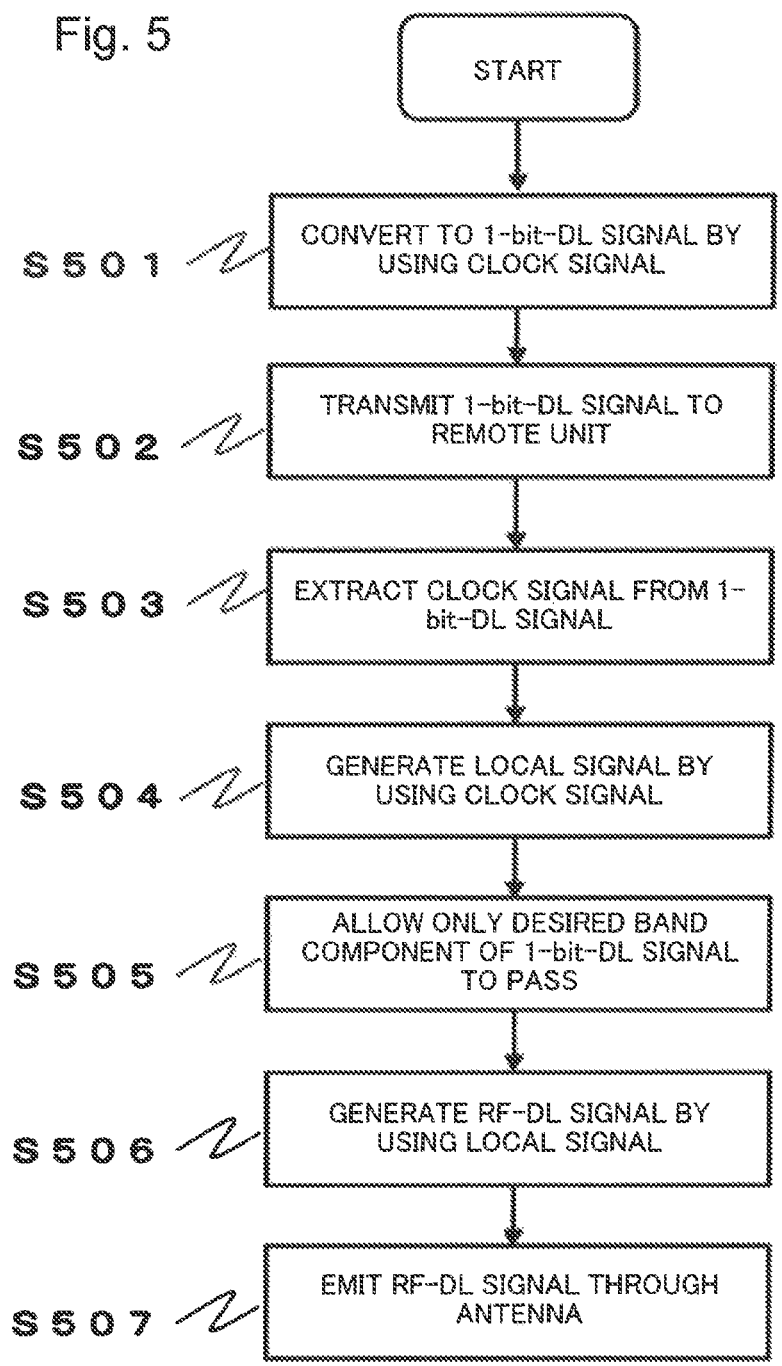
FIG. 5 is a process flow diagram of the wireless access system according to the first example embodiment.

A process flow in the wireless access system according to the first example embodiment of the present invention will be described next by using FIG. 5.

In the center unit 1, the 1-bit modulator 5 converts DL signals generated by the digital baseband 4 to a 1-bit-DL signal by using a clock signal received from the oscillator 6 (S501).

The center unit 1 transmits the 1-bit-DL signal to the remote unit 3 through the optical access unit 2 (S502).

In the remote unit 3, the local generation unit 10 extracts the clock signal from the 1-bit-DL signal received from the optical access unit 2 (S503).

In the remote unit 3, the local generation unit 10 generates a local signal by using the extracted clock signal as a reference signal (S504).

In the remote unit 3, the filter 13 passes only desired band components of the 1-bit-DL signal received from the optical access unit 2 (S505).

In the remote unit 3, the up-converter 14 multiplies the 1-bit-DL signal consisting of the desired band components received from the filter 13 by the local signal of a local frequency band flo received from the local generation unit 10 to generate an RF-DL signal with a frequency converted into an RF frequency band ftx (S506).

The remote unit 3 emits the generated RF-DL signal from the antenna 12 through the power amplifier 15 (S507).

While downlink signals have been described in the foregoing description, a principle similar to the principle for the downlink can be used for uplink signals.

A configuration of an uplink of the wireless access system according to the first example embodiment of the present invention will be described by using FIG. 6.

The remote unit 3 includes a duplexer 29 and a receiving unit 30 in addition to the local generation unit 10, the transmission unit 11 and the antenna 12. The receiving unit 30 includes a power amplifier 31, a down-converter 32 and a 1-bit-ΔΣ analog-digital converter (1-bit-ΔΣ ADC) 33. The local generation unit 10 includes a CDR 34 in addition to the CDR 23.

The remote unit 3 receives, at the antenna 12, an uplink signal (RF-UL signal) transmitted from a terminal and outputs the RF-UL signal to the receiving unit 30 through the duplexer 29. The power amplifier 31 of the receiving unit 30 amplifies the RF-UL signal received from the duplexer 29 to a desired level and outputs the amplified RF-UL signal to the down-converter 32.

The down-converter 32 multiplies the RF-UL signal received from the power amplifier 31 by a local signal of a local frequency band flo received from the CDR 34 of the local generation unit 10 to generate an IF-UL signal of an intermediate frequency band fIF. Note that the mechanism with which the CDR 34 generates the local signal is the same as that of the CDR 23 and therefore the description of the mechanism will be omitted.

The 1-bit-ΔΣ ADC 33 receives the IF-UL signal from the down-converter 32, generates a 1-bit-UL signal which is a 1-bit digital signal converted from the IF-UL signal, and transmits the 1-bit-UL signal to the center unit 1 through an optical access unit 35.

Figure 6:
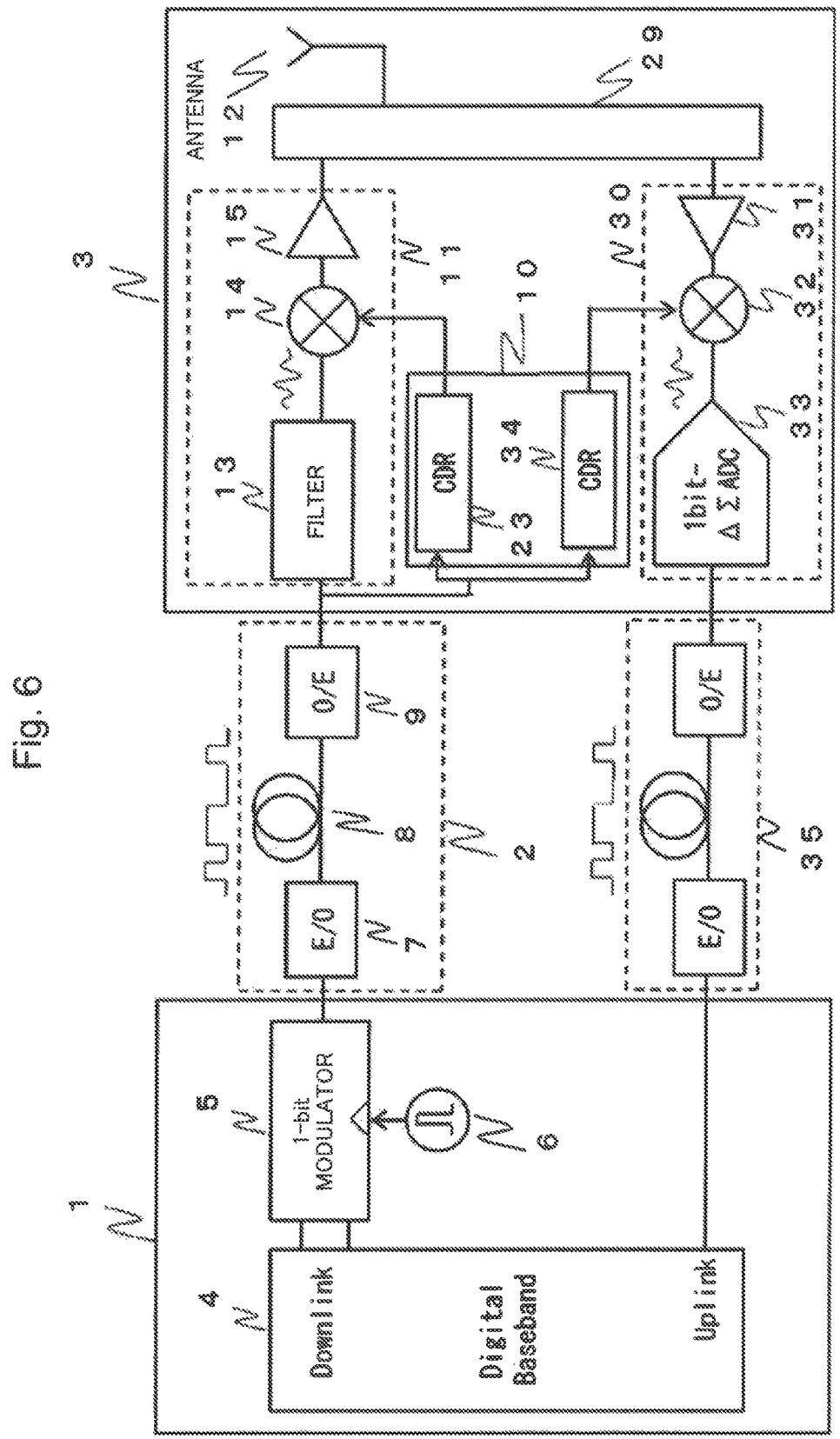
FIG. 6 is a configuration diagram of the wireless access system according to the first example embodiment.

Note that by providing the two CDRs, i.e. the CDR 23 for the downlink and the CDR 34 for the uplink, in the local generation unit 10 as illustrated in FIG. 6 and independently setting a division ratio for each divider, a frequency for an RF-DL signal and a frequency for RF-UL signal can be independently set. Further, if a common CDR is used for the downlink and the uplink, different local signals for the downlink and the uplink can be provided by adding an extra frequency converter at the VCO output. Of course, a common local signal for the downlink and the uplink may be provided and parameters may be designed so that a desired frequency of an RF-DL signal is achieved while a desired frequency may be selected for an RF-UL signal at the digital baseband.

Figure 14:
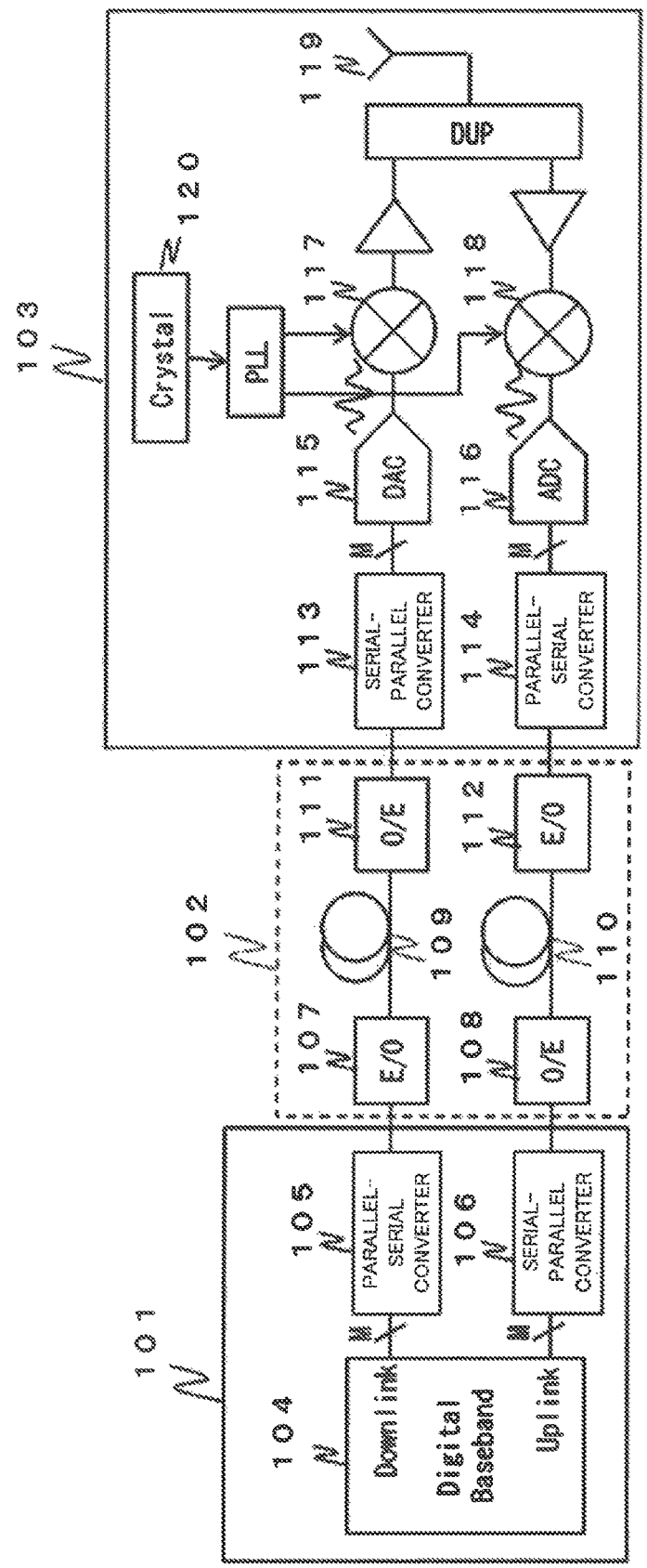
FIG. 14 is a configuration diagram of a wireless access system according to a related art.

As described above, in the wireless access system according to the first example embodiment of the present invention, since the local generation unit 10 of the remote unit 3 extracts a clock signal from a 1-bit-DL signal transmitted from the center unit 1 and generates a local signal by using the extracted clock signal as a reference signal, the wireless access system does not require a serial-parallel converter 113, a parallel-serial converter 114 and a crystal 120 and therefore can prevent increase in the complexity of the remote unit as compared to the related art illustrated in FIG. 14.

Figure 15:
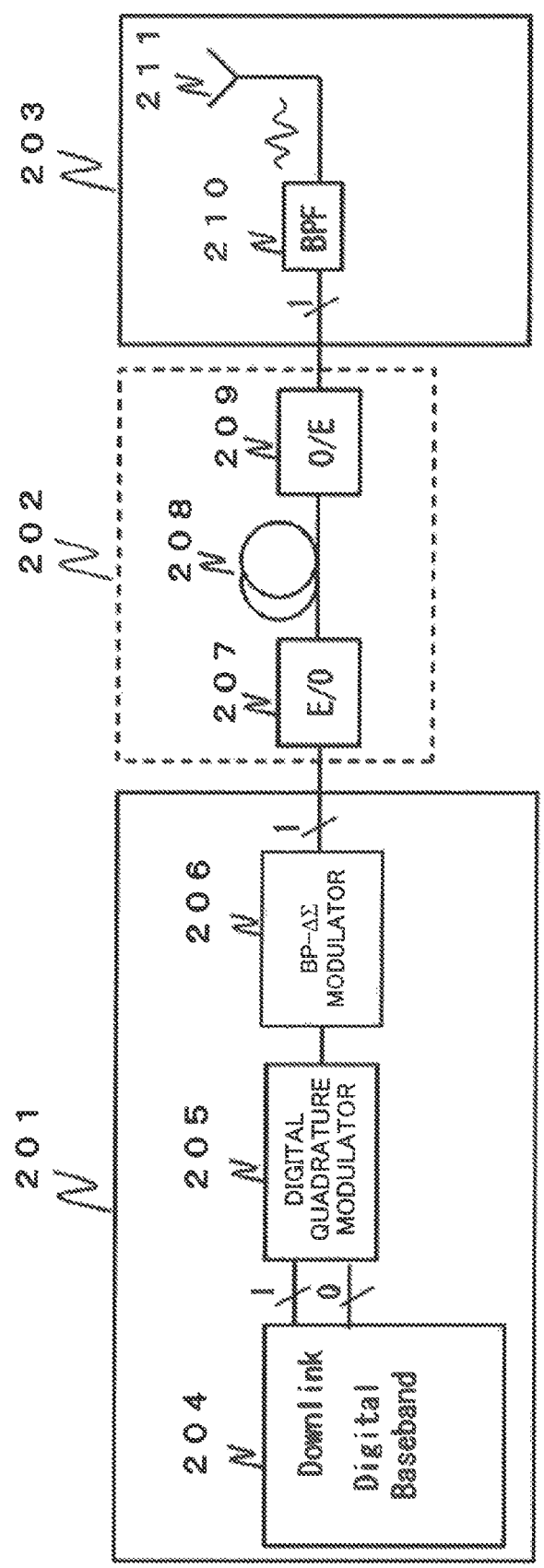
FIG. 15 is a configuration diagram of a wireless access system according to a related art.

Further, since the center unit 1 in the first example embodiment of the present invention includes the 1-bit modulator 5 instead of a bandpass ΔΣ modulator, the range of frequencies that can be produced at the remote unit is not dependent on the operating speed of a bandpass ΔΣ modulator 206 as illustrated in FIG. 15 and any frequency that can be produced using a local signal generator can be chosen. The current technology can handle up to several tens of gigahertz by using a local signal generator. Thus, in the wireless access system according to the first example embodiment of the present invention, a remote unit that is capable of handling a high-frequency region equal to or greater than 1 GHz can be implemented while preventing increase in the complexity of the remote unit.

Moreover, since the oscillator 6 of the center unit 1 in the first example embodiment of the present invention further includes the function of changing the clock rate of a clock signal to be output to the 1-bit modulator 5, frequency adjustment for the remote unit can be performed at the center unit and a frequency plan can be readily changed even after the remote unit is installed. Further, since baseband functionality is centralized at the center unit, the wireless access system can be dynamically changed to adapt to any of a plurality of communication methods, such as WiFi and private radio, in addition to mobile communication, at low cost by updating equipment at the center unit without making any changes to the remote unit.

Second Example Embodiment

Figure 7:
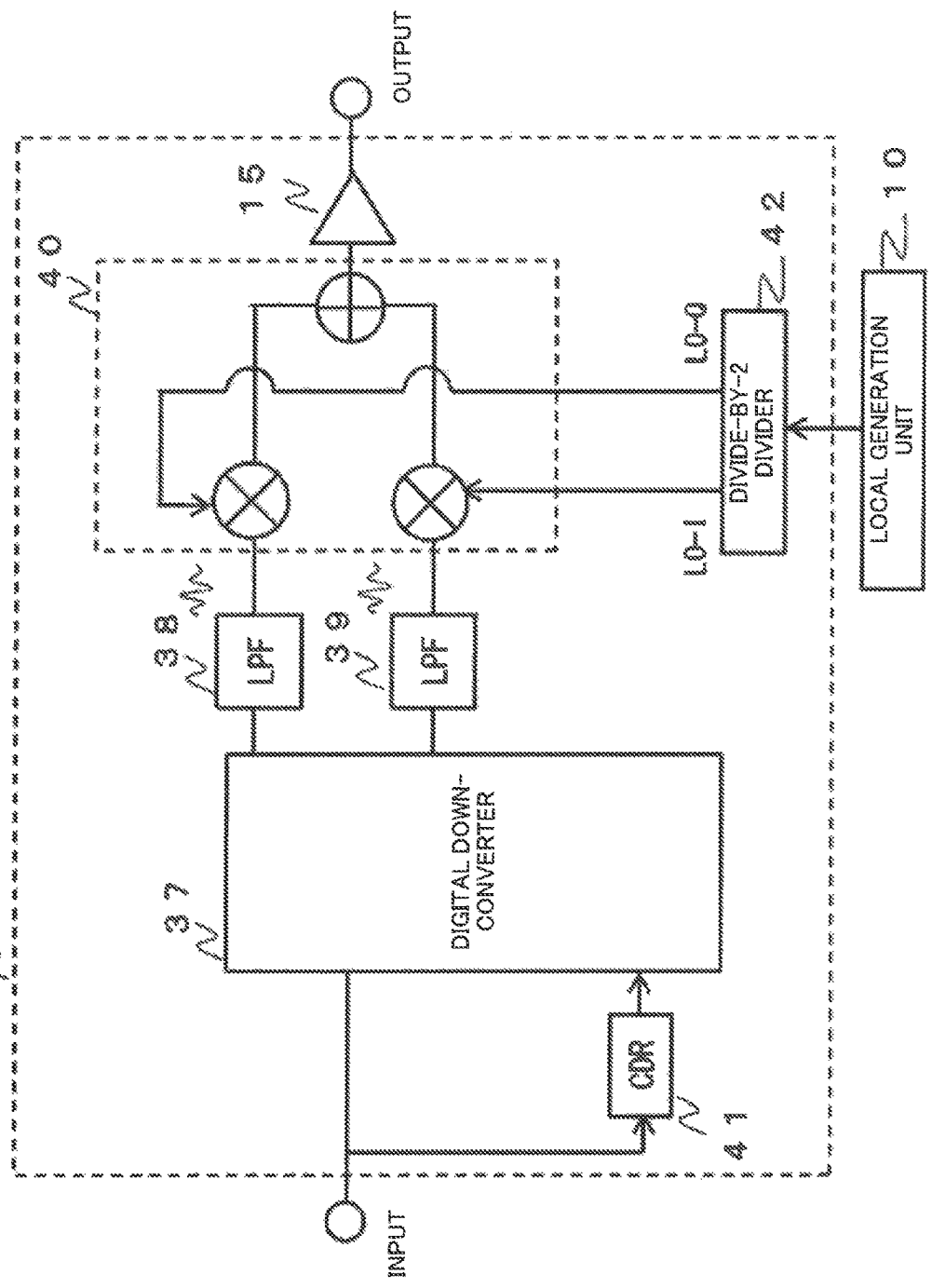
FIG. 7 is a configuration diagram of a transmission unit according to a second example embodiment.

A wireless access system according to a second example embodiment of the present invention will be described next. The wireless access system according to the second example embodiment of the present invention has a configuration in which a transmission unit 36 depicted in FIG. 7 is provided in place of the transmission unit 11 of the remote unit 3 of the first example embodiment of the present invention. Note that the configuration of the remote unit 3 except for the transmission unit 36 is the same as the configuration illustrated in FIGS. 1 and 6 and the description of the same part of the configuration will be omitted.

A configuration of the transmission unit 36 will be described by using FIG. 7. The transmission unit 36 includes a digital down-converter 37, a lowpass filter (LPF) 38, a lowpass filter 39, an up-converter 40, a power amplifier 15, a CDR 41 and a divide-by-2 divider 42.

The digital down-converter 37 quadrature-modulates a 1-bit DL signal received from an optical access unit 2 by using a clock signal received from the CDR 41, thereby down-converting the 1-bit DL signal to a baseband signal. A specific configuration of the digital down-converter 37 will be described later in detail.

The lowpass filters 38 and 39 allow only baseband components, including a desired signal, of two quadrature signals which are output signals from the digital down-converter 37, to pass toward the up-converter 40 and suppress the other components such as quantization noise.

The CDR 41 extracts a clock signal from a 1-bit DL signal received from the optical access unit 2 and generates a clock signal identical to that in the 1-bit DL signal. The CDR 41 outputs the generated clock signal to the digital down-converter 37.

The divide-by-2 divider 42 frequency-divides a local signal received from a local generation unit 10 by 2 to generate LO-I and LO-Q. The divide-by-2 divider 42 outputs the generated LO-I and LO-Q to the up-converter 40.

The up-converter 40 quadrature-modulates quadrature signals that have passed through the lowpass filters 38 and 39 by using LO-I and LO-Q received from the divide-by-2 divider 42 to generate an RF-DL signal having a frequency converted into a high-frequency band. The up-converter 40 outputs the generated RF-DL signal to the power amplifier 15.

A configuration of the digital down-converter 37 will be described next by using FIG. 8. The digital down-converter 37 includes a digital sine generator 43 and a digital quadrature demodulator 44.

The digital sine generator 43 generates a digital sinusoidal wave in which {1, 0, −1, 0} continuously appears from a clock signal received from the CDR 41. The digital sine generator 43 outputs the generated digital sinusoidal wave to the digital quadrature demodulator 44.

The digital quadrature demodulator 44 includes a delay device 45, a mixer 46, a mixer 47, a down-sampler (↓2) 48 and a down-sampler 49.

The delay device 45 receives a digital sinusoidal wave from the digital sine generator 43, delays the received digital sinusoidal wave by 1 and outputs the delayed digital sinusoidal wave to the mixer 47.

The mixer 46 receives the digital sinusoidal wave output from the digital sine generator 43 while the mixer 47 receives the delayed digital sinusoidal wave output from the delay device 45. The mixers 46 and 47 quadrature-modulate a 1-bit DL signal received from the optical access unit 2 by using the digital sinusoidal wave and the delayed digital sinusoidal wave, respectively.

The 1-bit DL signal that the mixers 46 and 47 receive from the optical access unit 2 is an output signal of a digital up-converter 18 in a center unit 1 received through the optical access unit 2. The 1-bit DL signal that the mixers 46 and 47 receive from the optical access unit 2 is a continuous signal with a pattern of {I', Q', −I', −Q'}, where I' and Q' are output signals from two ΔΣ modulators 16 and 17 in the center unit 1, respectively. By quadrature modulation using the digital sinusoidal wave and the delayed digital sinusoidal wave, the mixer 46 outputs a continuous signal with a pattern of {I', 0, I', 0} to the down-sampler 48 and the mixer 47 outputs a continuous signal with a pattern of {0, Q', 0, Q'} to the down-sampler 49.

The down-sampler 48 performs a process of down-sampling the signal received from the mixer 46 by a factor of 2, i.e. a process of keeping data every second sample and discarding the rest of the data. The down-sampler 49 performs a process of down-sampling the signal received from the mixer 47 by a factor of 2. Here, a signal output from the down-sampler 48 is denoted by I″ and a signal output from the down-sampler 49 is denoted by Q.

I″ is a signal obtained by multiplying a 1-bit DL signal by an output signal of the digital sine generator 43 and discarding, from the resulting signal, products obtained when the output signal of the digital sine generator 43 is 0 in down-sampling by a factor of 2 using the 1-bit DL signal, and is a continuous signal with a pattern of {I', I', I', I'}. Q″ is a signal that can be obtained by a similar operation using a delayed digital sinusoidal wave resulting from delaying an output signal of the digital sine generator 43 used during generation of I″ by 1 by the delay device 45, and is a continuous signal with a pattern of {Q', Q', Q', Q'}.

Accordingly, I″ and Q″ can be four signals as illustrated in FIG. 9 according to a phase relationship between a 1-bit DL signal input into the digital down-converter 37 and a sinusoidal wave generated by the digital sine generator 43. In each case, the relationship in which the phase of I″ is in advance of the phase of Q″ by 90 degrees is kept.

While the transmission unit 11 depicted in FIG. 1 requires a BPF as a filter 13, the transmission unit 36 depicted in FIG. 7 does not require a
BPF as a filter circuit and can be configured with an LPF instead. In general, an LPF is likely to implement steep filtering characteristics as compared to a BPF. Accordingly, in the wireless access system according to the second example embodiment of the present invention, the transmission unit 36 is capable of generating a high-frequency signal with a good signal-to-quantization-noise ratio in which quantization noise is sufficiently reduced.

Third Example Embodiment

Figure 10:
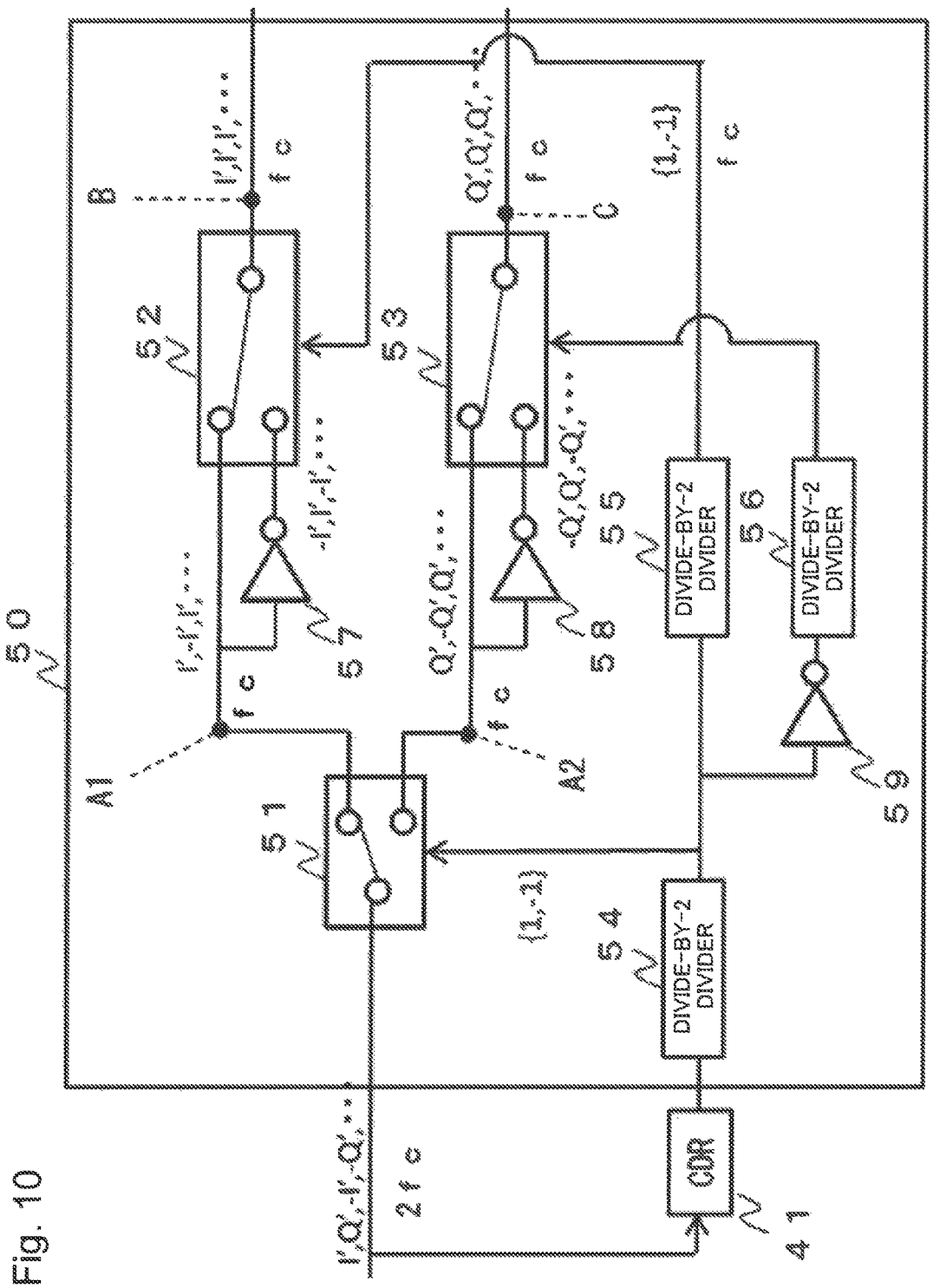
FIG. 10 is a configuration diagram of a digital down-converter according to a third example embodiment.

A wireless access system according to a third example embodiment of the present invention will be described next. The wireless access system according to the third example embodiment of the present invention has a configuration in which a digital down-converter 50 depicted in FIG. 10 is provided in place of the digital down-converter 37 of the transmission unit 36 in the remote unit 3 of the second example embodiment of the present invention. Note that the configuration except for the digital down-converter 50 is the same as the configuration illustrated in FIG. 7 and the description of the same part of the configuration will be omitted.

A configuration of the digital down-converter 50 will be described by using FIG. 10. The digital down-converter 50 includes a selector 51, a selector 52, a selector 53, a divide-by-2 divider 54, a divide-by-2 divider 55, a divide-by-2 divider 56, an inverter 57, an inverter 58 and an inverter 59.

The divide-by-2 divider 54 frequency-divides a local signal received from a CDR 41 by 2 and outputs the resulting signal to the selector 51, the divide-by-2 divider 55 and the inverter 59. The divide-by-2 divider 55 further frequency-divides the signal received from the divide-by-2 divider 54 by 2 and outputs the resulting signal to the selector 52. The inverter 59 inverts the signal received from the divide-by-2 divider 54 and outputs the resulting signal to the divide-by-2 divider 56. The divide-by-2 divider 56 further frequency-divides the signal received from the inverter 59 by 2 and outputs the resulting signal to the selector 53.

The selector 51 uses the signal received from the divide-by-2 divider 54 as a clock signal to selectively output a 1-bit-DL signal received from an optical access unit 2 to one of two paths (A1, A2), depending on whether the clock signal is high or low.

The inverter 57 receives a signal output from the selector 51 to one path (A1), inverts the received signal and outputs the inverted signal to the selector 52. The selector 52 receives, at one of its terminals, the signal output from the selector 51 to one path (A1) and receives, at the other terminal, the signal output from the inverter 57. The selector 52 uses a signal received from the divide-by-2 divider 55 as a clock signal and outputs the signal received from the selector 51 through one (A1) of the paths and its inverted signal alternately depending on whether the clock signal is high or low.

The inverter 58 receives the signal output from the selector 51 to the other path (A2), inverts the received signal and outputs the inverted signal to the selector 53. The selector 53 receives, at one of its terminals, the signal output from the selector 51 to the other path (A2) and receives, at the other terminal, the signal output from the inverter 58.

The selector 53 uses the signal received from the divide-by-2 divider 56 as a clock signal and outputs the signal received from the selector 51 through the other path (A2) and its inverted signal alternately depending on whether the clock signal is high or low.

Figure 11:
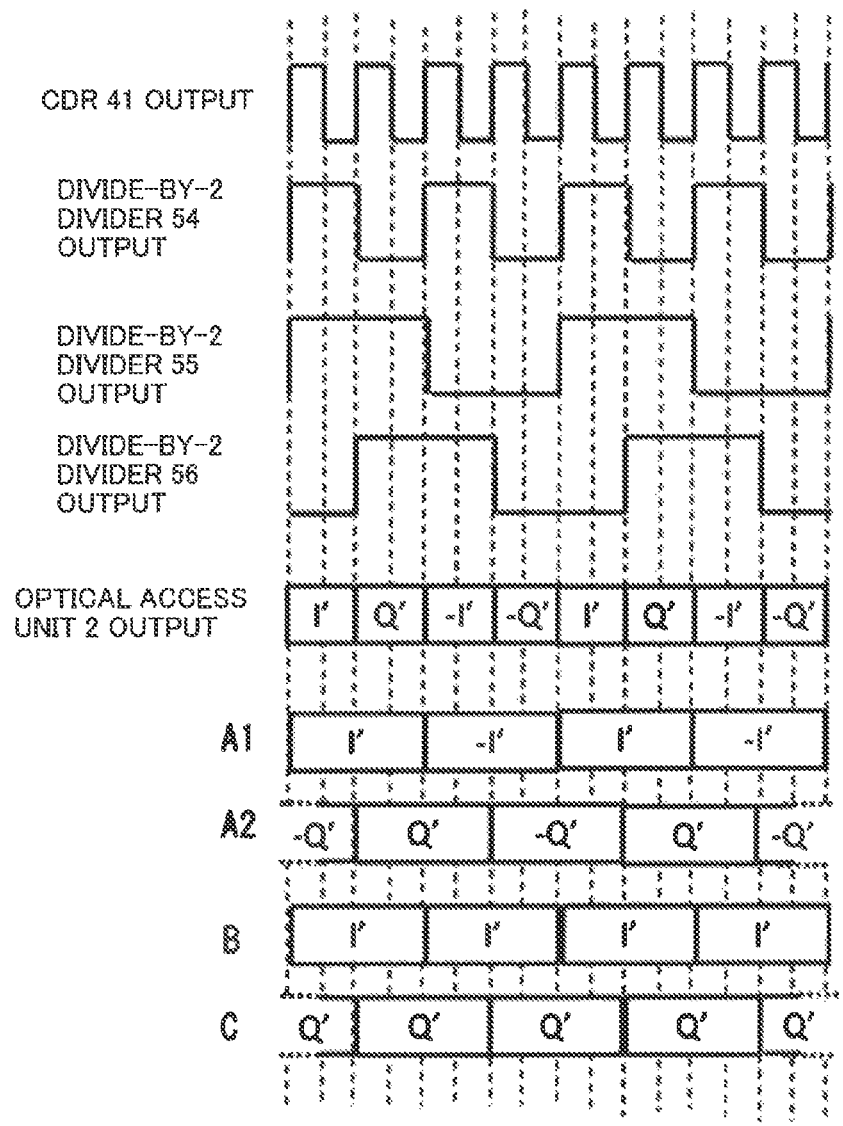
FIG. 11 is a diagram illustrating a phase relationship of the digital down-converter according to the third example embodiment.

How a 1-bit-DL signal input from the optical access unit 2 to the digital down-converter 50 is changed by the selectors 51 to 53 will be described next by using FIGS. 10 and 11. FIG. 11 is a diagram illustrating signals of the units.

A pattern of input of a 1-bit-DL signal from the optical access unit 2 to the selector 51 is a continuous pattern of {I', Q', −I', −Q'}. The selector 51 outputs a signal received when a clock signal received from the divide-by-2 divider 54 is high to one (A1) of the paths. Further, the selector 51 outputs a signal received when a clock signal received from the divide-by-2 divider 54 is low to the other path (A2).

The selector 51 thus outputs {I', −I'} to one path (A1) and outputs {Q', −Q'} to the other path (A2) at the time at which the 1-bit-DL signal is I' when the clock signal received from the divide-by-2 divider 54 is high.

A pattern of input to one terminal of the selector 52 is a continuous pattern of {I', −I'}. A pattern of input to the other terminal of the selector 52 through the inverter 57 is a continuous pattern of {−I', I'}. The selector 52 repeatedly outputs a signal received from the selector 51 through one path (A1) and its inverted signal in sequence and, as a result, outputs a continuous signal of {I'} to the path (B).

A pattern of input to one terminal of the selector 53 is a continuous pattern of {Q', −Q'}. Further, a pattern of input to the other terminal of the selector 53 through the inverter 58 is a continuous pattern of {−Q', Q'}. The selector 53 repeatedly outputs a signal received from the selector 51 through the other path (A2) and its inverted signal in sequence and, as a result, outputs a continuous signal of {Q'} to a path (C).

Note that, if the 1-bit-DL signal takes a value other than I' when the clock signal to the selector 51 is high, output signals from the selectors 52 and 53 change, but even in the case, the state in which the phase of the output signal from the selector 52 is in advance of the phase of the output signal from the selector 53 by 90 degrees is constantly kept. This is the same as keeping a phase difference between two output signals by the digital down-converter 37 depicted in FIG. 8 independently of the phase relationship between an input signal and the digital sine generator, as illustrated in FIG. 9.

Figure 8:
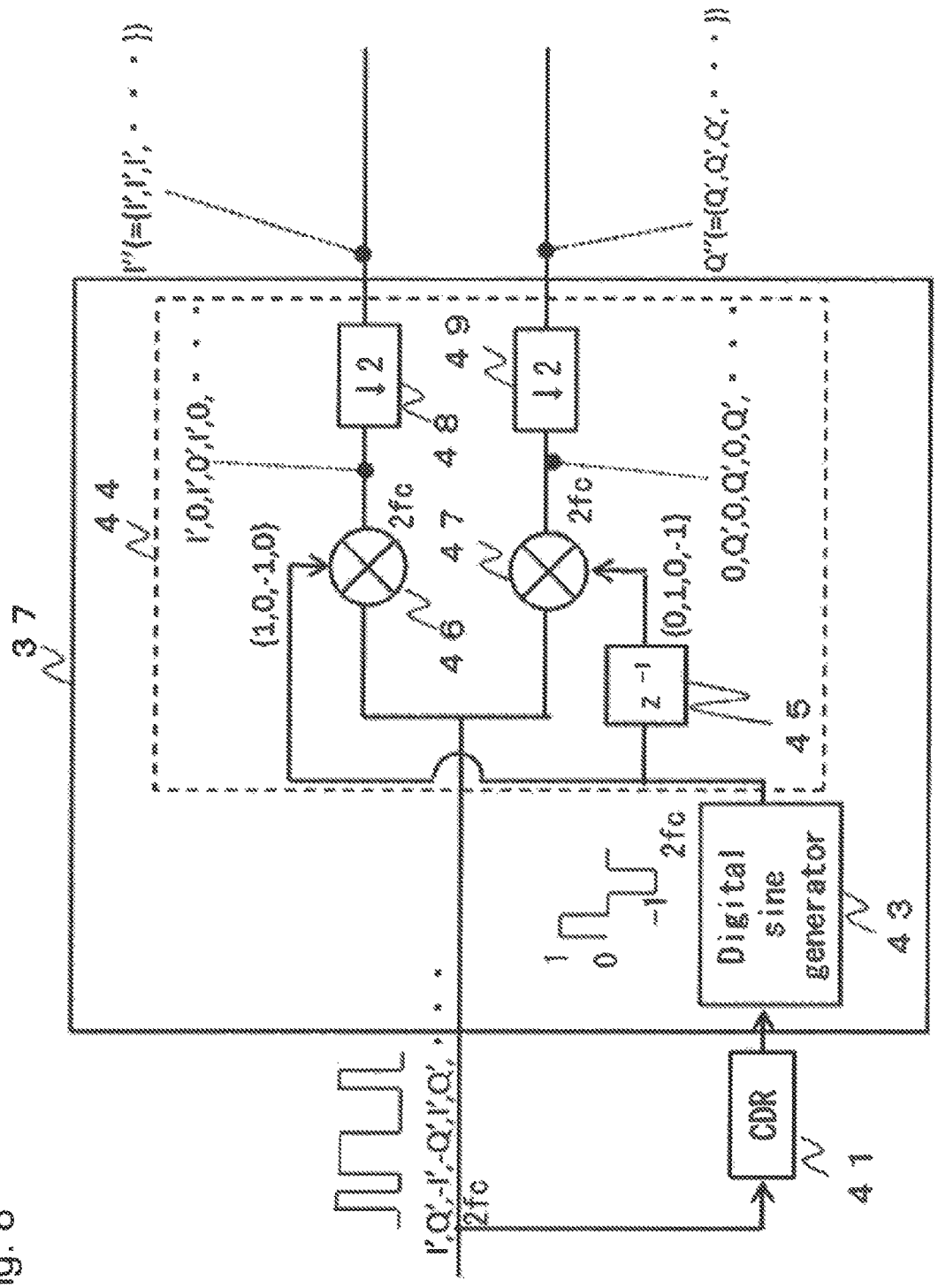
FIG. 8 is a configuration diagram of a digital down-converter according to the second example embodiment.

While the digital down-converter 37 depicted in FIG. 8 requires the digital sine generator 43 and the digital quadrature demodulator 44, the digital down-converter 50 of the third example embodiment depicted in FIG. 10 does not require the digital sine generator 43 and the digital quadrature demodulator 44 and can be configured with selectors, divide-by-2 dividers and inverters instead. Accordingly, in the wireless access system according to the third example embodiment of the present invention, a 1-bit DL signal received from the optical access unit 2 can be down-converted into a baseband signal without using the digital sine generator 43 and the digital quadrature demodulator 44.

Fourth Example Embodiment

Figure 12:
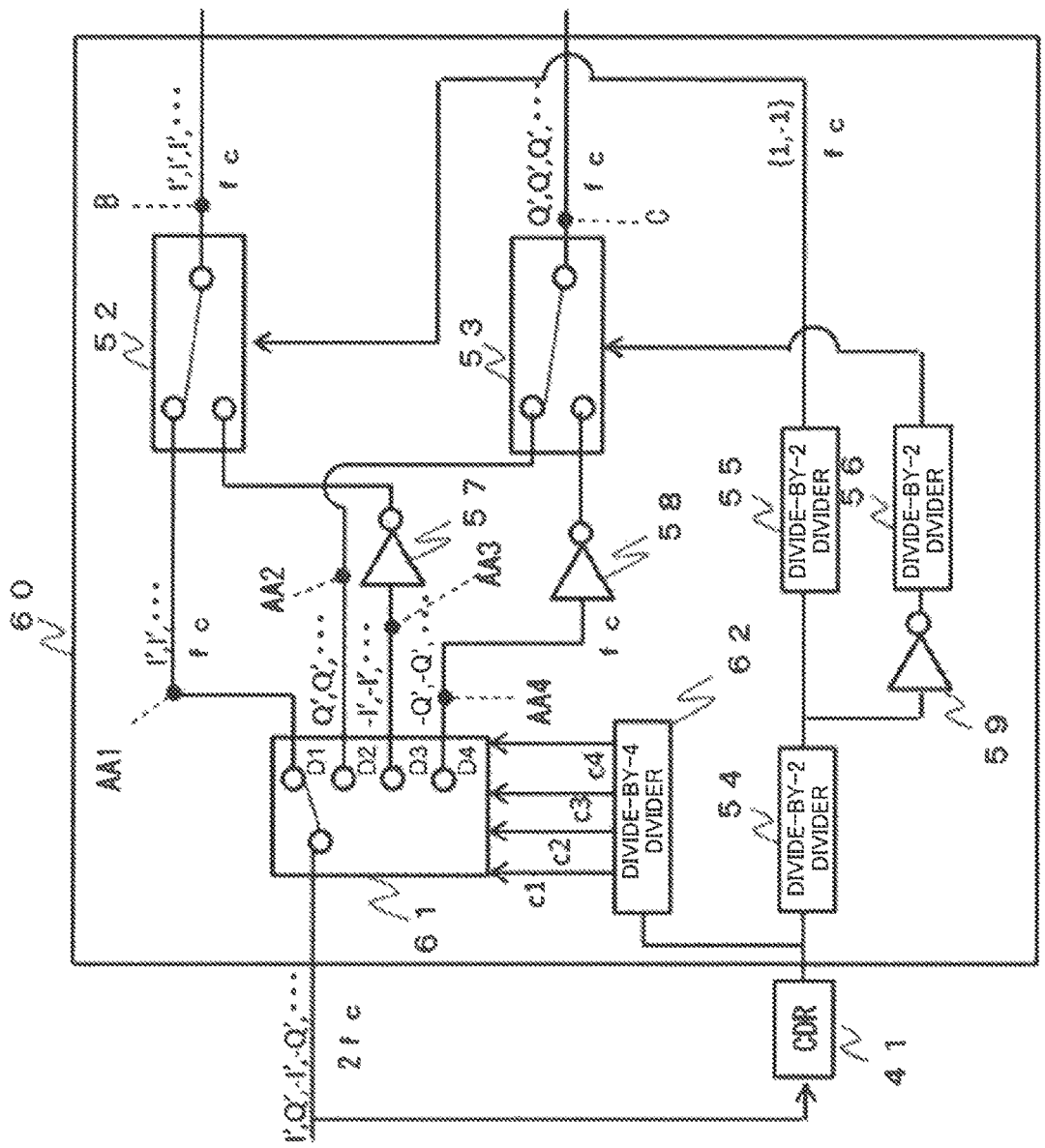
FIG. 12 is a configuration diagram of a digital down-converter according to a fourth example embodiment.

A wireless access system according to a fourth example embodiment of the present invention will be described next. The wireless access system according to the fourth example embodiment of the present invention has a configuration in which a digital down-converter 60 depicted in FIG. 12 is provided in place of the digital down-converter 37 of the transmission unit 36 in the remote unit 3 of the second example embodiment of the present invention. Note that the configuration except for the digital down-converter 60 is the same as the configuration illustrated in FIG. 7 and the description of the same part of the configuration will be omitted.

A configuration of the digital down-converter 60 will be described by using FIG. 12. The digital down-converter 60 includes a selector 61, a selector 52, a selector 53, a divide-by-2 divider 54, a divide-by-2 divider 55, a divide-by-2 divider 56, a divide-by-4 divider 62, an inverter 57, an inverter 58 and an inverter 59. Note that the selector 52, the selector 53, the divide-by-2 divider 54, the divide-by-2 divider 55, the divide-by-2 divider 56, the inverter 57, the inverter 58 and the inverter 59 have the same configurations as those illustrated in FIG. 10 and therefore the description thereof will be omitted.

The divide-by-4 divider 62 frequency-divides a local signal received from a CDR 41 by 4 to generate four frequency-divided signals whose phases are shifted by 90 degrees from one another. The divide-by-4 divider 62 outputs the generated four frequency-divided signals to the selector 61.

The selector 61 outputs a 1-bit-DL signal received from an optical access unit 2 to four paths (AA1, AA2, AA3, and AA4) in turn in synchronization with the four frequency-divided signals received from divide-by-4 divider 62.

Output terminals of the selector 61 are denoted by D1, D2, D3 and D4 in the order in which the 1-bit-DL signal is output. An output signal from D1 is input to one of the input terminals of the selector 52. An output signal from D2 is input to one of the input terminals of the selector 53. An output signal from D3 is input into the inverter 57. An output signal from D4 is input into the inverter 58.

Figure 13:
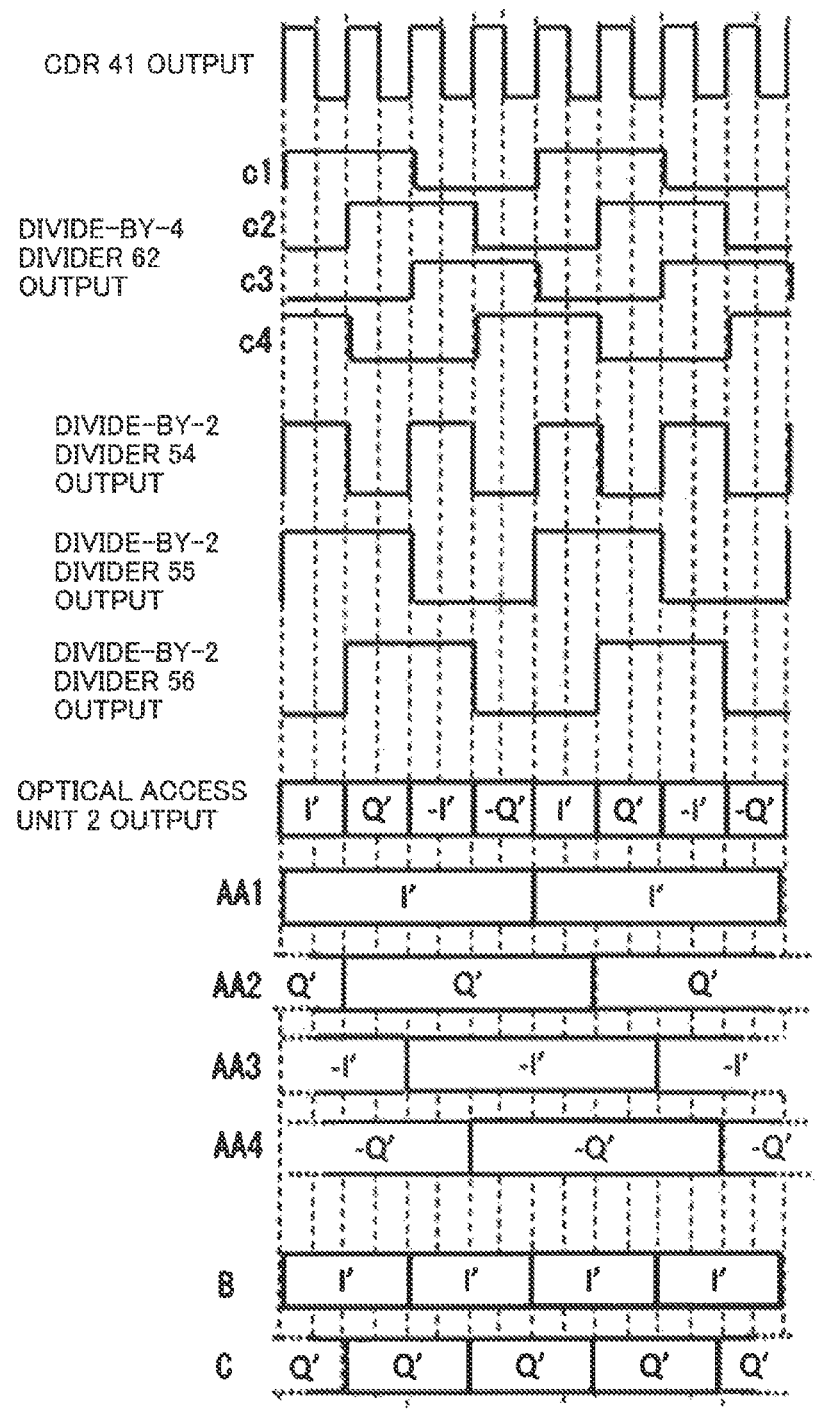
FIG. 13 is a diagram illustrating a phase relationship of the digital down-converter according to the fourth example embodiment.

How a 1-bit-DL signal input from the optical access unit 2 into the digital down-converter 60 is changed by the selectors 61, 52 and 53 will be described next by using FIGS. 12 and 13. FIG. 13 is a diagram illustrating signals of the units.

A pattern of input of the 1-bit-DL signal from the optical access unit 2 to the selector 61 is a continuous pattern of {I', Q', −I', −Q'}. The selector 61 outputs the 1-bit-DL signal received from the optical access unit 2 to the four paths (AA1, AA2, AA3, and AA4) in turn in synchronization with four frequency-divided signals received from the divide-by-4 divider 62.

Accordingly, when a signal output from D1 of the selector 61 is I', signals output from output terminals D1, D2, D3 and D4 are {I'}, {Q'}, {−I'}, and {−Q'}, respectively.

The selector 52 repeatedly and alternately outputs a signal received from D1 of the selector 51 and an inverted signal received from D3 of the selector 51 through the inverter 57. As a result, an output signal of the selector 52 is a continuous signal of {I'}. The selector 53 repeatedly and alternately outputs a signal received from D2 of the selector 51 and an inverted signal received from D4 of the selector 51 through the inverter 58.

As a result, an output signal of the selector 53 is a continuous signal of {Q'}.

Note that if the signal output from terminal D1 of the selector 61 takes a value other than I', output signals from the selectors 52 and 53 change, but even in the case, the state in which the phase of the output signal from the selector 52 is in advance of the phase of the output signal from the selector 53 by 90 degrees is constantly kept. This is the same as keeping a phase difference between two output signals by the digital down-converter 37 depicted in FIG. 8 independently of the phase relationship between an input signal and the digital sine generator as illustrated in FIG. 9.

While the digital down-converter 37 depicted in FIG. 8 requires the digital sine generator 43 and the digital quadrature demodulator 44, the digital down-converter 60 according to the fourth example embodiment illustrated in FIG. 12 does not require the digital sine generator 43 and the digital quadrature demodulator 44 and can be configured with selectors, divide-by-2 dividers, a divide-by-4 divider and inverters instead. Accordingly, in the wireless access system according to the fourth example embodiment of the present invention, a 1-bit DL signal received from the optical access unit 2 can be down-converted into a baseband signal without using the digital sine generator 43 and the digital quadrature demodulator 44.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2015-091784, filed on Apr. 28, 2015, the disclosure of which is incorporated herein in its entirety by reference.

REFERENCE SIGNS LIST

1 Center unit
3 Remote unit
4 Digital baseband
5 1-bit modulator
6 Oscillator
10 Local generation unit
13 Filter
14 Up-converter
16, 17 $\Delta\Sigma$ modulator
23, 34, 41 Clock data recovery circuit (CDR)
24 Voltage controlled oscillator (VCO)
25 Phase detector (PD)
26 Loop filter (LF)
27, 28 Divider (DIV)
32 Down-converter
33 1-bit-$\Delta\Sigma$ analog-digital converter (1-bit-$\Delta\Sigma$ ADC)
37, 50, 60 Digital down-converter
38 Lowpass filter (LPF)
51 to 53, 61 Selector

The invention claimed is:

1. A wireless access system comprising:
a center unit; and
a remote unit that is placed in a location away from the center unit, converts a baseband signal generated at the center unit to a high-frequency signal, and emits the high-frequency signal through an antenna, wherein
the center unit comprises a digital baseband that generates the baseband signal, an oscillator that generates a clock signal, and a 1-bit modulator that converts the baseband signal to a 1-bit signal, based on the clock signal, and outputs the 1-bit signal, and
the remote unit comprises a local generation unit that extracts a clock signal from the 1-bit signal output from the center unit and generates a local signal by using the extracted clock signal as a reference signal, a filter that extracts a desired band component from the 1-bit signal, and an up-converter that converts an output signal of the filter to the high-frequency signal by using the local signal.

2. The wireless access system according to claim 1, wherein the 1-bit modulator comprises a $\Delta\Sigma$ modulator that performs $\Delta\Sigma$ modulation.

3. The wireless access system according to claim 1, wherein the oscillator is capable of changing a clock rate of the clock signal to be generated.

4. The wireless access system according to claim 1, wherein the filter is configured with a digital down-converter that performs down conversion and a lowpass filter that extracts desired signal components from quadrature signals output from the digital down-converter.

5. The wireless access system according to claim 4, wherein:
the digital down-converter comprises a first selector that takes input of the 1-bit signal and outputs the 1-bit signal selectively to a plurality of paths, a second selector that takes input of a first signal among signals from the plurality of paths and an inverted signal of the first signal and alternately outputs the first signal and the inverted signal of the first signal, and a third selector that takes input of a second signal among signals from the plurality of paths and an inverted signal of the second signal and alternately outputs the second signal and the inverted signal of the second signal; and
the first selector, the second selector, and the third selector output output signals of the second selector and the third selector as the quadrature signals to the lowpass filter in synchronization with a clock signal extracted from the 1-bit signal.

6. The wireless access system according to claim 1, wherein the remote unit comprises a down-converter that down-converts a high-frequency signal received from a terminal through the antenna to a low-frequency-band signal by using a local signal generated by the local generation unit or a second local signal generated by a second local generation unit by extracting a clock signal from the 1-bit signal and using the extracted clock signal as a reference signal.

7. The wireless access system according to claim 6, wherein the remote unit comprises a $\Delta\Sigma$ analog-digital converter that converts a signal down-converted by the down-converter to a 1-bit signal.

8. A control method for controlling a wireless access system comprising a center unit and a remote unit that is placed in a location away from the center unit, converts a baseband signal generated at the center unit to a high-frequency signal, and emits the high-frequency signal through an antenna, the control method comprising:
converting, by the center unit, a baseband signal to a 1-bit signal by using a clock signal;
transmitting, by the center unit, the 1-bit signal to the remote unit;
extracting, by the remote unit, a clock signal from the 1-bit signal;
generating, by the remote unit, a local signal by using the extracted clock signal as a reference signal;
extracting, by the remote unit, a desired band component from the 1-bit signal; and
converting, by the remote unit, the desired band component to the high-frequency signal by using the local signal.

9. The control method according to claim 8, further comprising changing, by the center unit, a clock rate of the clock signal.

10. The control method according to claim 8, further comprising down-converting, by the remote unit, a high-frequency signal received from a terminal through the antenna to a low-frequency-band signal by using the local signal or a second local signal generated by using the extracted clock signal as a reference signal.

* * * * *